(12) United States Patent
Wieland

(10) Patent No.: US 10,110,343 B2
(45) Date of Patent: *Oct. 23, 2018

(54) METHOD AND ENCODING DEVICE FOR ENCODING A SEQUENCE OF M-BIT PATTERN WORDS AND OUTPUTTING A FRAME COMPRISING CORRESPONDING N-BIT SYMBOLS

(71) Applicant: Mapper Lithography IP B.V., Delft (NL)

(72) Inventor: Marco Jan-Jaco Wieland, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 105 days.

This patent is subject to a terminal disclaimer.

(21) Appl. No.: 15/196,711

(22) Filed: Jun. 29, 2016

(65) Prior Publication Data

US 2018/0006765 A1  Jan. 4, 2018

(51) Int. Cl.
*H03M 13/00* (2006.01)
*H04L 1/00* (2006.01)
*H04L 25/49* (2006.01)

(52) U.S. Cl.
CPC .......... *H04L 1/0041* (2013.01); *H04L 1/0058* (2013.01); *H04L 25/49* (2013.01)

(58) Field of Classification Search
CPC ............................. H04L 1/0041; H04L 1/0058
See application file for complete search history.

(56) References Cited

U.S. PATENT DOCUMENTS

| | | | |
|---|---|---|---|
| 4,486,739 A | 12/1984 | Franaszek et al. | |
| 5,148,453 A | 9/1992 | Newby et al. | |
| 7,405,679 B1 | 7/2008 | Widmer | |
| 7,928,866 B2 * | 4/2011 | Boles | H04L 12/413 341/58 |
| 2009/0073413 A1 * | 3/2009 | Abrams | G03F 7/70116 355/71 |
| 2009/0195421 A1 | 8/2009 | Kim et al. | |
| 2014/0254724 A1 | 9/2014 | Gopalan | |

(Continued)

FOREIGN PATENT DOCUMENTS

| | | |
|---|---|---|
| EP | 0097763 A2 | 1/1984 |
| EP | 0 097 763 | 9/1988 |

(Continued)

OTHER PUBLICATIONS

Sadka, A. H., et al. "Aspects of Error Resilience for Block-based Video Coders in Multimedia Communications." Insights into Mobile Multimedia Communications. Ed. D.R. Bull, et al. San Diego: Academic Press 1999. pp. 431-443.

(Continued)

*Primary Examiner* — Guy Lamarre
(74) *Attorney, Agent, or Firm* — Womble Bond Dickinson (US) LLP

(57) ABSTRACT

The present invention relates to a method and encoding device for encoding a sequence of m-bit pattern words and outputting as a bit-stream a frame comprising corresponding n-bit symbols as well as a predetermined comma symbol, wherein m<n, wherein occurrences of false commas in the output bitstream are avoided. The output bitstream may further be optimized based on CID count and DC balance.

24 Claims, 9 Drawing Sheets

(56) References Cited

U.S. PATENT DOCUMENTS

2018/0006668 A1* 1/2018 Wieland .............. H04L 27/2278

FOREIGN PATENT DOCUMENTS

EP            1775679      *   4/2007           G06T 1/0028
WO     WO-9641439 A1     12/1996

OTHER PUBLICATIONS

Hakkennes, E.A., et al, "Demonstration of Real Time pattern correction for high throughput maskless lithography" Proc. of SPIE, vol. 7970, 79701A. pp. 1-11. (2011).
Coles, A. "Error Reporting and Synchronization Recovery." pp. 1-10. (1998).
"Data Interchange on Read-Only 120 mm Optical Data Disks (CD-ROM)", Standard ECMA-130, 2nd Edition, Jun. 1996, pp. 1-45.
Immink, K.A. Schouhamer, "Codes for Mass Data Storage Systems, Chapter 5,8 and 11", Shannon Foundation Publishers, 2004, pp. 95-136, 195-242, 377-304.
Immink, K.A. Schouhamer, "Codes for Mass Data Storage Systems, Chapter 5,8 and 11", Shannon Foundation Publishers, 2004, pp. 95-136, 195-242, 277-304.
Wikipedia Article entitled "8b/10b encoding." Retrieved from "https://en.wikipedia.org/wiki/8b/10b_encoding" on Jan. 14, 2016. 8 pages.

* cited by examiner

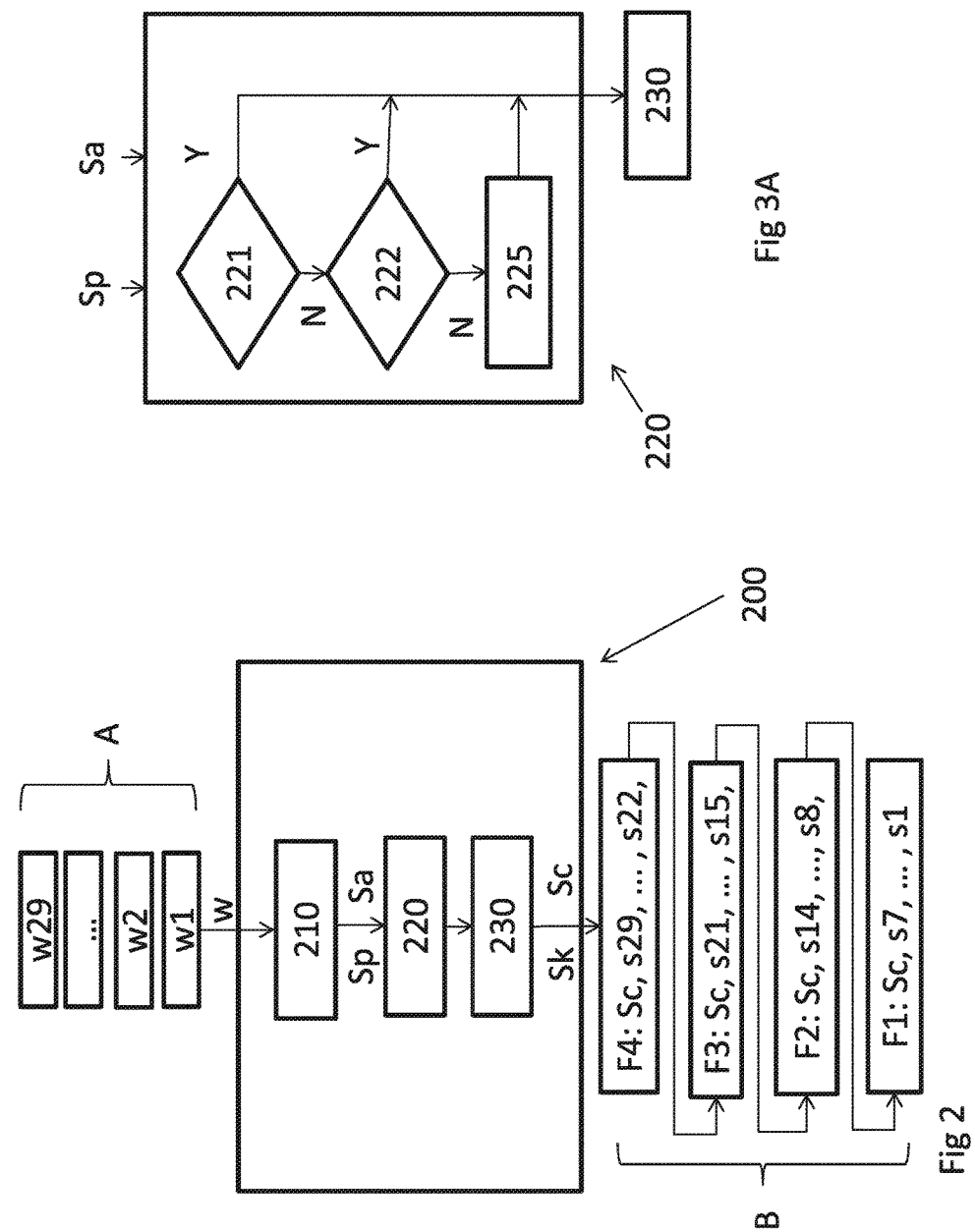

Table 1

| # | w | Sp | Sa |
|---|---|---|---|
| 1 | 0011100 | 10010010 | 01101101 |
| 2 | 0111010 | 11011110 | 00100001 |
| 3 | 0000001 | 10101000 | 01010111 |
| 4 | 1111111 | 01010100 | 10101011 |
| 5 | 1111011 | 01011100 | 10100011 |
| 6 | 1010101 | 00000000 | 11111111 |
| 7 | 1110101 | 01000000 | 10111111 |
| 8 | 1101101 | 01110000 | 10001111 |
| 9 | 1010101 | 00000000 | 11111111 |
| 10 | 1010101 | 00000000 | 11111111 |
| 11 | 1111111 | 01010100 | 10101011 |
| 12 | 1111111 | 01010100 | 10101011 |
| 13 | 1111111 | 01010100 | 10101011 |
| 14 | 1101010 | 01111110 | 10000001 |
| 15 | 1111111 | 01011100 | 10100011 |
| 16 | 0000000 | 10101010 | 01010101 |
| 17 | 1011011 | 00011100 | 11100011 |
| 18 | 0000100 | 10100010 | 01011101 |
| 19 | 0001101 | 10110000 | 01001111 |
| 20 | 1100011 | 01101100 | 10010011 |
| 21 | 1111011 | 01011100 | 10100011 |

Table 2

| Sc |
|---|
| 01011100 |

Table 3

| # | , | Sp CID | Sp DC | , | Sa CID | Sa DC | Out |
|---|---|---|---|---|---|---|---|
| 1 | - | 2 | -2 | - | 2 | 2 | 10010010 |
| 2 | - | 4 | 2 | - | 4 | -6 | 11011110 |
| 3 | - | 3 | 0 | - | 3 | 4 | 10101000 |
| 4 | - | 4 | -2 | - | 3 | 2 | 01010100 |
| 5 | c | 3 | -2 | - | 3 | -2 | 10100011 |
| 6 | - | 8 | -10 | - | 10 | 6 | 11111111 |
| 7 | - | 9 | 0 | - | 10 | 12 | 01000000 |
| 8 | - | 4 | 4 | - | 4 | 8 | 01110000 |
| 9 | - | 12 | -4 | - | 8 | 12 | 00000000 |
| 10 | - | 19 | -12 | - | 11 | 4 | 11111111 |
| 11 | - | 8 | 2 | - | 9 | 6 | 01010100 |
| 12 | - | 3 | 0 | - | 2 | 4 | 01010100 |
| 13 | - | 3 | -2 | - | 2 | 2 | 01010100 |
| 14 | - | 6 | 2 | - | 6 | -6 | 01111110 |
| 15 | c | 3 | -2 | c | 3 | -2 | 01011100 |
| 16 | - | 3 | -2 | - | 2 | -2 | 10100011 |
| 17 | - | 4 | -4 | - | 3 | 0 | 10101010 |
| 18 | - | 3 | -6 | - | 3 | -2 | 00011100 |
| 19 | - | 4 | -4 | - | 4 | 0 | 01011101 |
| 20 | - | 4 | 0 | - | 5 | 0 | 01001111 |
| 21 | c | 3 | 0 | - | 3 | 0 | 01011100 |

Fig. 4B

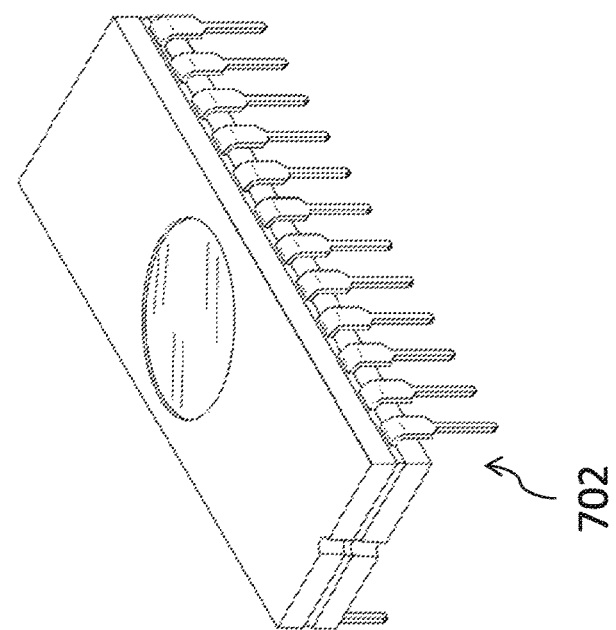
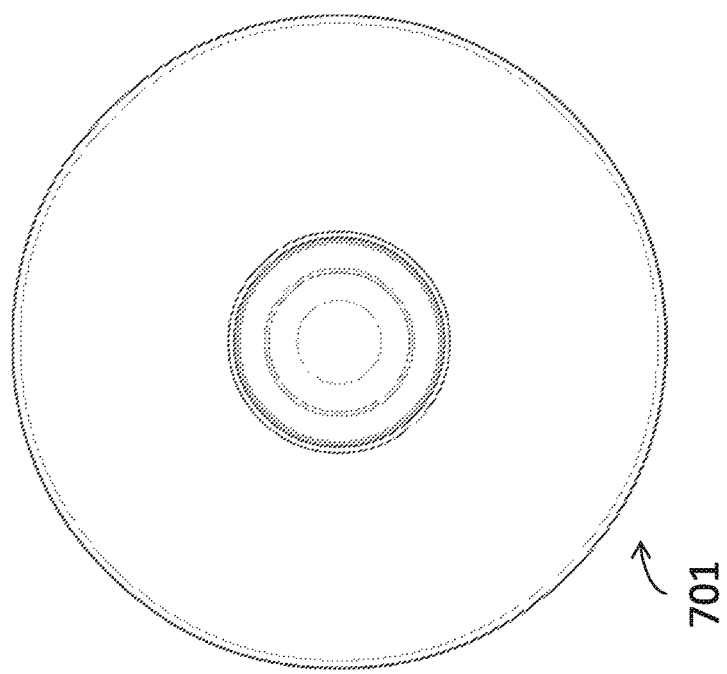
Fig. 7

METHOD AND ENCODING DEVICE FOR ENCODING A SEQUENCE OF M-BIT PATTERN WORDS AND OUTPUTTING A FRAME COMPRISING CORRESPONDING N-BIT SYMBOLS

BACKGROUND

The invention relates to a method and encoding device for encoding a sequence of m-bit pattern words as a bit-stream comprising a frame comprising corresponding n-bit symbols, with m<n, said frame further comprising an n-bit comma symbol. Encoding of m-bit pattern words to n-bit pattern symbols, with m<n, is known, for instance from 8B/10B symbol mapping in which a number of consecutive 8-bit pattern words are mapped into a bit-stream of 10-bit encoded pattern symbols and vice versa.

8B/10B encoding is often used in scenarios in which comparable resources, which include computational power and space, are available at an encoder and at a corresponding decoder. FIG. 1A provides a prior art example of such a scenario and schematically shows transmitter/receivers 102 and 103 each comprising a encoding device E and a corresponding decoding device D. Both the encoding device E and decoding device D of each transmitter/receiver typically comprise pre-stored tables used for encoding and decoding respectively, and in general decoding of encoded data requires about the same amount of computational resources as encoding the data itself. In this scenario the computational capability of each encoding device E and its corresponding decoding device D is thus substantially the same, and both require roughly the same amount of space, as indicated schematically by the size of the encoders and decoders in FIG. 1A.

Such 8B/10B encoding is particularly adapted for use in scenarios in which there is two-way communication between transmitter/receivers 102 and 103, in particular when the amount of data sent by transmitter/receiver 102 to transmitter/receiver 103 is of a same order of magnitude as the amount of data sent by transmitter/receiver 103 to transmitter receiver 102, as indicated by the size of the arrows, and wherein space and/or computational requirements at the decoding device do not form a substantial limiting factor when implementing the decoding device.

FIG. 1B shows another scenario in which the amount of available space and/or computational resources at an encoder E is much larger than the space and/or computational resources available at a decoder D, and which is an intended scenario for the present invention. In the example shown, the encoder E is part of a pattern streamer 106 of a maskless lithography system, and the decoder D is part of a beam blanker array 107 of a maskless lithography system, wherein the beam blanker array may be adapted for individually blanking beamlets of a plurality of beamlets, said plurality comprising tens of thousands or hundreds of thousands or more beamlets. The amount of data sent by such a pattern streamer 106 to the beam blanker array 107 is typically in the range of tens of gigabits per second or more and is orders of magnitude greater than the two data streams of FIG. 1A, as shown by the size of the arrow. Though the beam blanker array 107 shown in FIG. 1B does not transmit any data to other devices, in an alternative embodiment the beam blanker array may be adapted to transmit some data, e.g. quality control data indicative of properties of the received input bit-stream such as number of comma symbols detected therein, to an external device. In such a case the amount of data sent by the beam blanker array—if any—is orders of magnitude less than the amount sent by the encoder E, and in in general is not encoded at all. Regardless, the amount of space and/or computational resources available at the decoding device D, which is here shown comprised in the beam blanker array 107, is much smaller than at the encoding device E as indicated schematically by the size of the encoding device E and decoding device 107 in FIG. 1B.

An implementation of 8B/10B mapping in which the redundancy provided by extending m bits to n bits is used to define at least one comma symbol which has a unique bit pattern that does not occur in any two consecutive symbol mappings, i.e. pattern symbols, for the pattern words, is described in European Patent no EP 97 763. In this comma-based implementation a number of m-bit patterns are encoded into a data frame which comprises a corresponding number of encoded n-bit symbols which map the m-bit pattern words, as well as a comma symbol to delimit the start or end of the frame. Upon receipt of a bit-stream at a decoder side, the beginning or end of a frame is determined based on detection of a comma symbol in the stream. When frames are received they may thus be synchronized to provide a measure of robustness against bit-skip errors which may occur during transmission of the frame.

Decoding n-bit symbols which have been encoded using 8B/10B encoding requires a substantial amount of computational resources. Though other coding schemes are known which can be decoded using fewer computational resources, these generally have as a drawback that a false comma symbol, i.e. an unintended comma symbol bit sequence, can frequently occur in the output bit-stream, which can throw off frame synchronization at a decoder. A reliable frame synchronization is particularly important to prevent bit-skip errors from accumulating when large numbers of frames are transmitted in this manner. For instance, when the m-bit pattern data comprises data for patterning a wafer in a lithography system, millions of frames are typically transmitted for patterning a single wafer, and accumulation of bit skip errors could result in pattern data being written at the wrong positions on the wafer.

It is an object of the present invention to provide a method and encoding device which at least partially resolves these issues.

SUMMARY OF THE INVENTION

To this end, according to a first aspect, the present invention provides a method of encoding a sequence of m-bit pattern words and outputting as a bit-stream a frame comprising corresponding n-bit symbols as well as a predetermined comma symbol, wherein m<n, wherein said method comprises: for each of said m-bit pattern words, generating a corresponding primary n-bit symbol, and if said m-bit pattern word is part of a predetermined set of m-bit pattern words, generating a corresponding alternative n-bit symbol; said method further comprising:

selecting the primary symbol in case only a primary symbol was generated, and otherwise:

i) selecting either said primary symbol or said alternative symbol, wherein if only one of said primary symbol and alternative symbols, when appended to a directly preceding symbol in the output bit-stream, does not form a false comma in said two appended symbols, said one symbol is selected;

outputting said one selected symbol as a pattern symbol in said output bit-stream;

each time after having consecutively output multiple pattern symbols in said output bit-stream, outputting said comma symbol in said output bit-stream.

Comma symbols in an output bit-stream are often used to delimit a frame, and the method helps to prevent false commas from being included in the output bit-stream, allowing more reliable detection of the beginning and/or end of frames in the output bit-stream. For example, when a directly preceding symbol in the output bit-stream is the comma symbol, then according to the method, if both a primary and alternative symbol exist for a given pattern word but one of these would form a false comma when appended to the comma symbol, then the other is selected to be output in the output bit-stream.

The logic for determining whether a false comma would be formed and/or for ensuring other desirable properties of the output bit-stream is only required during encoding but is not needed during decoding. Consequently, decoding can be carried out in a relatively simple manner when compared to the encoding.

The number of consecutively output pattern symbols is typically a fixed number which defines the number of symbols in a frame, with the number of symbols in each frame preferably being fixed to a number between m and n+1, more preferably to a number is equal to n. For instance, each frame may consist of a number of m n-bit pattern symbols as well one comma symbol for delimiting the frame, so that each frame consists of n symbols in total.

The primary and/or alternative symbols for each pattern word may also be also denoted primary and alternative pattern symbols to distinguish such symbols from other symbols which are not representative of m-bit pattern words. Preferably the primary and alternative pattern symbols are generated in such a manner that a false comma cannot not occur in any two consecutive n-bit pattern symbols in the output bit-stream. This further prevents false commas from being included in the output bit-stream. Though ensuring this property requires additional computational resources prior to or during encoding, it reduces the computational resources required during decoding as no checks for false commas have to be carried out when decoding.

Though the comma symbol is typically an n-bit comma symbol, in an alternative embodiment the comma symbol may consist of more than n bits.

In an embodiment the method further comprises, if in step i) neither of the primary and alternative symbols form a false comma in said two appended symbols:

ii) selecting said primary or alternative symbol which results in a minimum number of consecutive identical digits when appended to a consecutive identical digit tail of the output bit-stream in case both said symbols would result in a number of consecutive identical digits which exceeds a predetermined threshold when appended to the consecutive identical digit tail of the output bit-stream.

Herein, the consecutive identical digit tail of the output bit-stream is defined as the maximum number of consecutive identical digits starting from the digit that was last output in the output bit-stream. In the following two examples it is assumed that the predetermined threshold is eleven. In the first example, an output bit-stream has a tail portion " . . . 1100 1111 1111 1111 1111 0" of which the consecutive identical digit tail is "0" and has a CID count of 1, as the number of consecutive identical digits starting from the right hand side of the bitstream and moving to the left equals 1. In the second example, an output bit-stream has a tail portion " . . . 1100 1111 1111 1111 1111" of which the consecutive identical digit tail is "1111 1111 1111 1111" and has a CID count of 16. It is noted that the "1100" at the beginning of both these bit-streams does not form part of the consecutive identical digit tail.

If, when an output bitstream is the bit-stream of the first example, either a primary symbol "1000 0010" or an alternative symbol "0111 1101", which is the inverse of the primary symbol, may be selected to be output in the output bitstream, then appending the primary symbol to the consecutive identical digit tail would result in "0 1000 0010" with a CID count of 5, and appending the alternative symbol to the CID tail would result in "0 0111 1101", also with a CID count of 5. In this example, neither symbol when appended to the CID tail would exceed the threshold CID count of 11, so no selection would be made based on the CID count.

If however the output bit-stream is the bit-stream of the second example, then appending the primary symbol to the consecutive identical digit tail would result in "1111 1111 1111 1111 1000 0010" with a CID count of 15, whereas appending the alternative symbol to the CID tail would result in "1111 1111 1111 1111 0111 1101", with a CID count of 14. According to the present embodiment, the alternative symbol would be selected as it results in the minimum CID count when appended to the output bit-stream.

Though during encoding the entire CID tail of the output bitstream may be stored, e.g. in a memory, this is not required in order to be able to make the selection. The selection may for instance be made instead based on the last digit of the CID tail together with an indication of the number of consecutive identical digits starting from the end of the tail. Such an indication could be a number between 1 and the threshold, or simply an indication that said number is greater than the threshold. For instance, in the second example it would suffice to determine that the CID tail ends in more than the threshold value of 11 consecutive "1"'s to be able make the selection between the primary and the alternative symbol.

In general, the number of n-bit pattern symbols in each frame is fixed and the one comma symbol in each frame contains both a "1" bit and a "0" bit, so that there is an upper limit to the CID count in the output bit-stream.

Besides avoiding false commas in the output bit-stream, the present embodiment provides an output bit-stream in which the number of consecutive identical digits (CID) is kept relatively low, thus reducing the chance of bits being skipped during transmission of the bit-stream.

The predetermined threshold preferably is greater than 10, more preferably is in the range from 10 to 13, and most preferably equals 11. This reduces the chance of bit-skip errors while at the same time allowing additional freedom in selecting either the primary or alternative symbol to be output, allowing further optimization of the output bit-stream. When m=7 and n=8, these threshold values, in particular the value of 11, have been found to be especially advantageous as they prevent overly large CID sequences from occurring in the output bitstream while allowing additional criteria for selecting between a primary and alternative symbol. The output bit-stream may thus be generated to have further desirable properties.

In a further embodiment the method comprises, if in step ii) the number of consecutive identical digits would be equal to or below said predetermined threshold for both the primary and alternative symbols when appended to the consecutive identical digit tail of the output bit-stream:

iii) selecting said primary or alternative symbol which results in a minimum direct current balance magnitude when appended to the output bit-stream.

A low direct current (DC) balance magnitude of the output bit-stream is desirable as it helps to receive the bit-stream with fewer errors. By minimum direct current balance magnitude herein is meant the minimum absolute value of the DC balance, e.g. both a DC balance of −3 and 3 have a magnitude of 3. According to this embodiment the output bit-stream is thus optimized such that, in order or priority, first: if possible, false commas are avoided if both a primary and an alternative symbol exist for a pattern word, second: the CID count of the output bitstream is kept relatively low, and third: the direct current balance (DC balance) magnitude is minimized.

In an alternative embodiment the DC optimization has a higher priority than the CID count optimization, or can be carried out without any CID count optimization at all. In such cases the method comprises, if in step i) neither of the primary and alternative symbols form a false comma in said two appended symbols: selecting said primary or alternative symbol which results in a minimum direct current balance magnitude when appended to the output bit-stream.

In an embodiment the multiple pattern symbols consist of a number of pattern symbols equal to or less than n. More preferably, the number of consecutive pattern symbols that is output before each comma symbol is output is a fixed number of consecutive pattern symbols, e.g. equal to m, and each frame contains a fixed number of pattern symbols as well as a comma symbol.

In an embodiment said primary and said alternative symbols each comprise encoded pattern information associated with their corresponding m-bit pattern word, as well as decode information which allows decoding of the encoded pattern information based only upon the pattern symbol. Thus, each pattern symbol contains all information that is necessary to derive a pattern word therefrom, allowing pattern symbols to be decoded in a simple fashion. In particular, for decoding a pattern symbol, no knowledge about the pattern symbol is required, though preferably an indication of whether pattern symbol is synchronized or not is available.

Herein, upon receiving an n-bit pattern symbol from a bit-stream, e.g. at a decoder, the n-bit symbol is said to be synchronized if it is clear during decoding what the start and end position of an n-bit symbol in the received bit-stream are. If during transmission of a bit-stream if some of the bits in the bit-stream are skipped, e.g. are transmitted but do not reach a receiver or decoder, loss of synchronization may occur.

In an embodiment said encoded pattern information of the alternative symbol is generated as the inverse of the encoded pattern information of the primary symbol, preferably wherein the decode information of the alternative symbol is generated as the inverse of the decode information of the primary symbol. Decoding can thus be performed based only on the information that is present in an n-bit pattern symbol in the output bitstream, independent on whether the n-bit pattern symbol is a primary symbol or an alternative symbol.

In an embodiment the corresponding primary symbol for an m-bit pattern word is generated to comprise encoded pattern information as:
  the bits of the m-bit pattern word in which bits at two or more predetermined bit-positions are inverted; or
  the bits of the m-bit pattern word in which all bits other than those at the two or more predetermined bit-positions are inverted;
wherein said primary symbol further comprises decode information indicative of whether the bits at the two or more predetermined bit positions or all other bits have been inverted, preferably wherein said decode information has the form of a decode information bit. The two or more predetermined bit positions preferably are either (m/2) or (m/2)+1 predetermined bit positions, e.g. all odd or even bit positions.

Though many mappings of a pattern word to a primary symbol are possible, the present mapping, in particular in combination with the directly preceding embodiment, has as an advantage that both generation of the primary and/or alternative symbols is simple, as is decoding of each n-bit pattern symbol. Moreover, in applications in which the majority of pattern m-bit words consist of either m 1-bits or m 0-bits, as is often the case if the pattern words contain data for patterning a wafer in a maskless lithography system, this embodiment helps to keep both the CID count as well as the absolute DC balance of the output bit-stream low.

In an alternative embodiment said generating said corresponding primary and/or alternative symbol for an m-bit pattern word comprises using a predetermined look-up table.

In an embodiment generating said corresponding primary symbol and/or alternative symbol comprises scrambling bits of the corresponding m-bit pattern word, wherein for each m-bit pattern word there is one unique scrambled m-bit pattern word. Herein, scrambling means swapping bits at predetermined positions in the m-bit pattern with bits at other predetermined positions in the m-bit pattern word, to arrive at a scrambled m-bin pattern word. At a decoder side, after decoding a pattern symbol from the bitstream, the scrambling may easily be reversed.

In an embodiment said predetermined set of m-bit pattern words comprises a majority of possible pattern words. For instance, if there are $2^m$ different m-bit pattern words all of which may possibly be encoded, then for at least $2^{m-1}$ pattern words both a primary and alternative symbol are generated. The greater the number of pattern words for which both a primary and an alternative symbol are generated, the greater the flexibility in optimizing properties of the output bitstream. Preferably the predetermined set of m-bit pattern words comprises at least three fourths of the possible pattern words, and more preferably at least seven eights of the possible pattern words.

In an embodiment, if an m-bit pattern word is not part of said predetermined set of m-bit pattern words, then the corresponding primary symbol is generated such that no combination of said primary symbol with any other possible symbol, i.e. primary or alternative symbol or comma symbol, results in a false comma in said combination. It is thus ensured that, when for a given pattern word only a corresponding primary symbol is generated, this primary symbol does not form part of a false comma in the output bit-stream. Such primary symbols can be determined in advance, i.e. before encoding the sequence of m-bit pattern words, dependent on the contents of the predetermined comma symbol and for instance by using an exhaustive search as will be apparent to the person skilled in the art.

In an embodiment the comma symbol has a direct current balance magnitude of 1 or less and a consecutive identical digit length of 3 or less. Insertion of a comma symbol in the output bit-stream thus does not or hardly affects the DC-balance of the output bit-stream, and the relatively small CID value of the comma symbol reduces the chance of bit-skip occurring during transmission of the comma symbol. The last three bits of the comma symbol are preferably either "001" or "110".

In an embodiment each of said primary and alternative symbols is generated such that appending the comma symbol thereto cannot result in a false comma in the two appended symbols. Formation of a false commas in the output bit-stream is thus further prevented. This may for instance be achieved by determining a complete mapping of all pattern words to a primary symbol and optionally one or more alternative symbols as well, and checking for each specific mapping of a pattern word to a pattern symbol whether that pattern symbol directly followed by a comma symbol results in more than one comma symbol bit-sequence. Generation of symbols by the symbol generation circuitry may be based on a predetermined complete mapping in which no pattern symbol followed by a comma symbol results in more than one comma-symbol bit-sequence. Such a complete mapping can for instance be found using an exhaustive search through all possible mappings.

In an embodiment said primary and alternative symbols for each m-bit pattern word are generated such that for said m-bit pattern word a corresponding primary and/or alternative symbol exists having a direct current balance magnitude of 2 or less and a consecutive identical digit length of 3 or less. Insertion of a pattern symbol in the output bit-stream thus does not or hardly affects the DC-balance of the output bit-stream, and the relatively small CID value of each pattern symbol reduces the chance of bit-skip occurring during transmission thereof. Suitable mappings of pattern words to pattern symbols may again be found by means of an exhaustive search through possible complete mappings as indicated above. Preferably, a majority or even all of the primary and alternative symbols have a DC-balance of 2 or less and a CID length of 3 or less.

According to a second aspect, the present invention provides an encoding device configured to receive a sequence of m-bit pattern words and to output as a bit-stream a frame comprising corresponding n-bit symbols as well as a predetermined comma symbol, wherein m<n, said encoding device comprising:

symbol generation circuitry configured to, upon receipt of each m-bit pattern word, generate a corresponding primary n-bit symbol, and further for generating a corresponding alternative n-bit symbol if said received m-bit pattern word is part of a predetermined set of m-bit pattern words;

symbol selection circuitry adapted for selecting the primary symbol in case only a primary symbol is generated, and otherwise for performing a step of:

i) selecting either said primary or said alternative symbol, wherein if only one of said primary symbol and alternative symbol, when appended to a directly preceding symbol in the output bit-stream, does not form a false comma in said two appended symbols, said one symbol is selected;

output circuitry adapted for outputting said one selected symbol as a pattern symbol in said bit-stream, and adapted for outputting a comma symbol in said bit-stream each time after having consecutively output multiple pattern symbols in said output bit-stream.

The encoding device is thus adapted to provide an output bit-stream containing frames of pattern symbols, with each frame being delimited by a comma symbol, and wherein inclusion of false commas in the output bit-stream is avoided. In case neither the primary symbol nor the alternative symbol would result in a false comma when appended to a directly preceding symbol, e.g. a comma symbol or pattern symbol, in the output bit-stream then the symbol to be output in the bit-stream may be selected based on further criteria.

In an embodiment said symbol selection circuitry is further adapted for, if in step i) neither of the primary and alternative symbols form a false comma in said two appended symbols, performing a step of:

ii) selecting said primary or alternative symbol which results in a minimum number of consecutive identical digits when appended to a consecutive identical digit tail of the output bit-stream in case both said symbols would result in a number of consecutive identical digits which exceeds a predetermined threshold when appended to the consecutive identical digit tail of the output bit-stream.

Once the primary objective of avoiding false commas is met, the encoding device thus selects a primary or alternative symbol such that the CID count in the resulting output bit-stream preferably does not exceed the predetermined threshold.

In an embodiment said symbol selection circuitry is further adapted for, if in step ii) the number of consecutive identical digits would be equal to or below said predetermined threshold for both the primary and alternative symbols when appended to the consecutive identical digit tail of the output bit-stream, performing a step of: iii) selecting said primary or alternative symbol which results in a minimum direct current balance magnitude when appended to the output bit-stream. The encoder thus has a further criterion of limiting the absolute DC balance of the output bitstream.

In an embodiment the predetermined comma symbol has a DC-balance of 1 or less and a consecutive identical digit length of 3 or less. For example, when n equals 8, suitable comma symbols are "0101 1100", or the inverse thereof, "1010 0011", which both have a DC balance of 0 and a CID length of 3.

In an embodiment the symbol generation circuitry is configured for generating said primary and alternative symbols such that at least one of these has a DC-balance of 2 or less and a consecutive identical digit length of 3 or less. This helps keeping the DC-balance and CID-count of the output bit-stream relatively low.

In an embodiment the symbol generation circuitry is configured for generating said symbols such that appending the comma symbol to any preceding non-comma symbol cannot result in a false comma in the two appended symbols. Non comma symbols include and may consist of all pattern symbols.

In an embodiment the number of consecutively output pattern symbols after which a comma symbol is output is a predetermined fixed number, preferably equal to or less than n, and more preferably equal to n.

In an embodiment each generated pattern symbol comprises encoded pattern information associated with its corresponding m-bit pattern word as well as decode information which allows decoding of the encoded pattern information based only on said n-bit symbol. This allows pattern symbols in the output bit-stream to be decoded independently of earlier pattern words in the output bit-stream. The decode information is preferably included in each pattern symbol as a decode bit.

In an embodiment the symbol generation circuitry is adapted for generating, for each m-bit pattern word, a corresponding primary symbol based on the m-bit pattern word and said decode information, said primary symbol comprising:

the bits of the m-bit pattern word in which bits of two or more predetermined bit positions are inverted, or the bits of the m-bit pattern word in which all other bits than those at two or more predetermined bit positions are inverted;

wherein said decode information is indicative of whether the bits at the two or more predetermined bit positions or at other bits have been inverted. Decoding of pattern symbols generated in this manner is particularly simple and requires very little computational resources at a decoder.

In an embodiment the symbol generation circuitry is adapted for generating a corresponding alternative symbol for an m-bit pattern word as the inverse of the primary symbol. Thus, once the primary symbol had been generated, generation of the alternative symbol is straightforward.

In an embodiment said symbol generation circuitry is adapted for generating said one or more n-bit symbols using a predetermined look-up table. The look-up table, which can be stored in RAM or ROM on the encoder device, can be calculated in advance so that the primary and alternative symbols have desirable properties. Such desirable properties include: the look-up table comprises both a primary symbol and an alternative symbol for more than half of all possible pattern words; and when a primary and alternative symbol are available for a given pattern word, at least one of these symbols does not form a false comma when appended to a comma symbol.

According to a third aspect the present invention provides a multi-beam lithography system for patterning a target, such as a wafer, said system comprising:

a memory containing a sequence of m-bit pattern words with pattern data for patterning said target, an encoding device as described herein, arranged for encoding said m-bit pattern words from said memory and to output as a bit-stream a frame, said frame comprising corresponding n-bit patterns symbols as well as a predetermined n-bit comma symbol which does not occur om any two consecutive n-bit pattern symbols in said output bit-stream, a beam source, adapted for providing a plurality of beamlets for patterning the target, a beam blanker array, for individually blanking beamlets of said plurality of beamlets based on the pattern symbols in the frames output by the encoding device.

In multi-beam lithography systems, in particular in charged particle multi-beam lithography systems in which the beam source comprises a charged particle beam source, often huge amounts of pattern data have to be transmitted to a beam blanker array in order to pattern a target such as a wafer. When bit-skip errors occur during transmission, this may lead to errors in the pattern that is written on the target. If frame synchronization is not carried out correctly upon receipt by the beam blanker array of the output bitstream, such bit-skip errors may accumulate. By using an encoder as described herein, the chances of synchronization errors due to false commas in the received output bitstream are reduced.

According to a fourth aspect, the present invention provides a computer readable medium, comprising instructions thereon for causing a computer to perform the method as described herein.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which:

FIG. 2 shows a flow chart of a method according to the present invention, FIGS. 3A and 3B-3D respectively show a flow chart of a detail of selection step 220 of FIG. 2, and flow charts of alternative selection steps which may take the place of selection step 220 in FIG. 2, FIG. 4B shows in table 1 a sequence of m-bit pattern words and corresponding primary and alternative symbols, in table 2 a bit sequence which forms a comma symbol, and in table 3 and example bitstream that is output if the sequence of m-bit pattern words of table 1 is encoded with corresponding primary and alternative symbols for each pattern word being generated in the manner illustrated in FIG. 4A.

DETAILED DESCRIPTION OF THE INVENTION

Figure 1B:
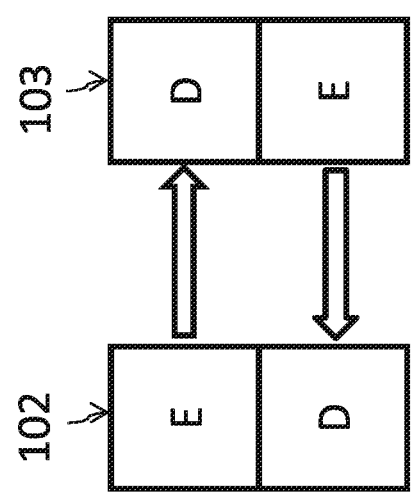
FIG. 1A schematically shows a scenario in which both encoding and decoding require substantially the same amount of resources, as known from the prior art, FIG. 1B schematically shows a scenario in which encoding requires substantially more resources than decoding, and for which the present invention is especially suitable.
Figure 1A:
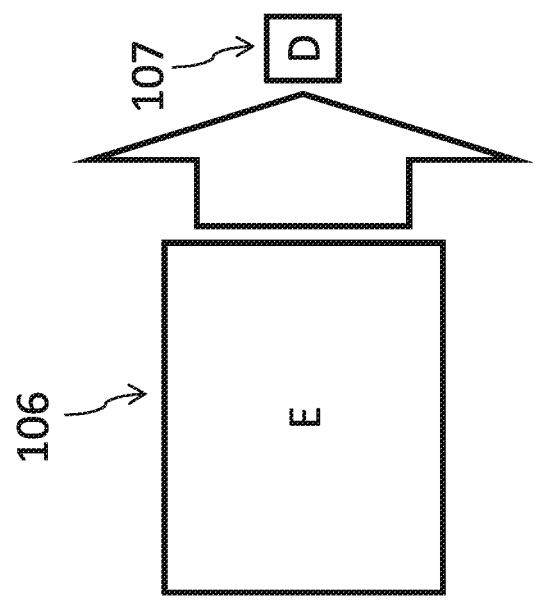

FIG. 2 shows a flowchart 200 of a method according to the present invention. Further shown are a sequence A of m-bit pattern words w1 . . . w29 to be encoded in accordance with the method, and which may for instance be retrieved from a memory or data storage that is adapted for storing billions or more of the pattern words. A bit-stream B which is output as a result of carrying out the method is also shown and comprises a number of frames F1, . . . F4. Each frame in the bit-stream B comprises a fixed number of n-bit pattern symbols s1 . . . s29, with each of the pattern symbols corresponding to one of the m-bit pattern words w1 . . . w29 in the sequence A, and with m<n. Each frame further comprises a comma symbol Sc delimiting the frame in the output bit-stream.

Given that m<n, there can be more unique pattern symbols than unique pattern words, and for many pattern words two corresponding pattern symbols exist so that a selection between such corresponding pattern symbols can be made to achieve desirable properties of the output bit-stream. According to the present invention occurrences of false commas in the output bitstream are reduced or even completely prevented by performing the following steps.

In step 210 a corresponding primary n-bit pattern symbol Sp is generated for each pattern word w that is to be encoded. If the pattern word is an element of a predetermined set of m-bit pattern words then also an alternative pattern symbol Sa is generated in step 210. All primary and alternative pattern symbols contain all information necessary for deriving the corresponding m-bit pattern word based only on the pattern symbol and can thus be decoded independent of other pattern symbols in the output bit-stream B.

In the preferred case wherein n=m+1, the number of possible pattern words is at most $2^m$ and the number of corresponding pattern symbols can be no greater than twice this. In practice, the actual number of pattern symbols will be less as at least the n-bit comma symbol Sc must be distinguishable from pattern symbols in the pattern stream.

The case of n=m+1 is preferred as the increase in space usage due to encoding remains relatively low; for example, 7-bit pattern words may be encoded as 8-bit pattern symbols at a cost of 12.5% more bits in the encoded pattern symbols than in the pattern words. If in this example each frame contains seven 8-bit pattern symbols as well as one 8-bit comma symbol, then each frame of 64 bits encodes 49 bits of pattern data as well as the comma symbol which may be used for determining the start or end of a frame.

After the primary and optionally the alternative symbol for a pattern word w have been generated, the method continues with step 220 in which one of these symbols is selected based on a number of conditions or criteria which are described with reference to FIG. 3A.

Subsequently, in step 230 the selected pattern symbol Sk is output in the output bit-stream B. In the same step a comma symbol Sc is output in the bit-stream each time after having consecutively output multiple pattern symbols. In the embodiment shown, a comma symbol Sc is output in the bit-stream each time a consecutive series of 7 pattern symbols has output in the output bit-stream. When the number of pattern symbols after which a comma symbol is output is fixed, as is the case in the present example, this number may also be referred to as the frame symbol count.

FIG. 3A shows the symbol selection step 220 in more detail. At the start of step 220 the primary symbol Sp, and—if available—also the alternative symbol Sa have already been generated for a pattern word. In step 221 it is checked whether only a primary symbol has been generated. If this is the case then this symbol is selected, and the selected symbol is passed on to be output in step 230.

Otherwise, it is checked in step 222 whether only one of the primary and alternative symbols, when appended to a directly preceding symbol in the output bit-stream, does not form a false comma in the two appended symbols. If this is the case, then that symbol which does not form a false comma is selected and passed on to be output in step 130. The method thus helps avoid inclusion of false commas in the output bit-stream.

If step 222 does not result in selection of a single pattern symbol, the method proceeds to step 225 one of the primary and alternative symbols is selected. This selection may be based on a comparative condition which can only be passed by one of the primary and alternative symbol, such as largest or smallest relative lexicographical value of the symbols. E.g. if a primary symbol "1011 0010" and alternative symbol "0100 1101" both would not form a false comma when appended to the output bitstream, then the alternative symbol would be selected as it has the smallest lexicographic value of the two. Alternatively, step 225 may simply always select the primary symbol to be passed on to be output in step 230. In any case, if in neither of the preceding steps of the step 220 only one pattern symbol is selected, step 225 ensures that only one pattern symbol is selected to be output in the bitstream.

Figure 3C:
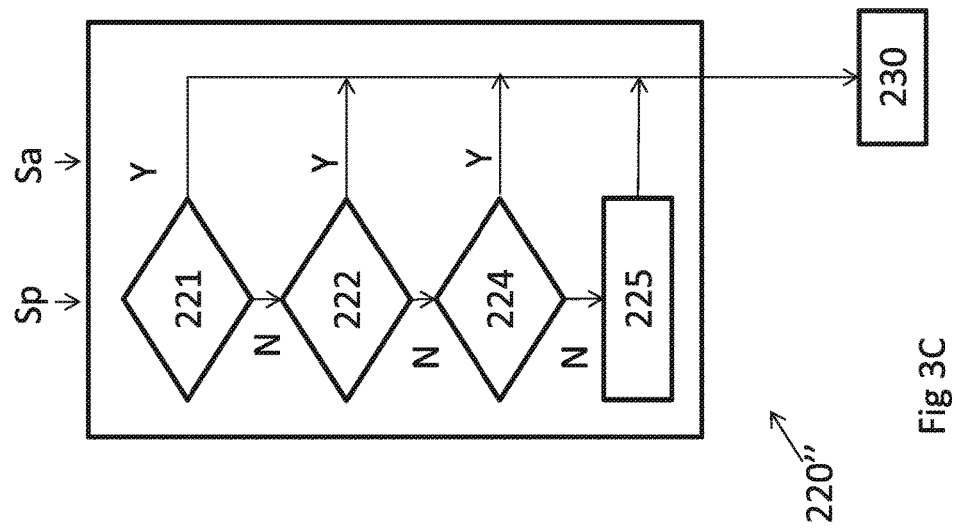
Figure 3B:
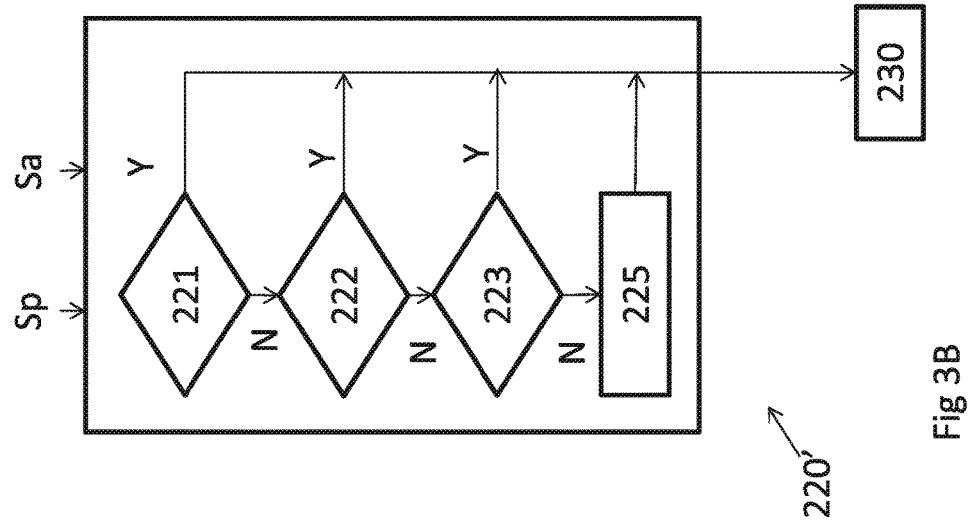
Figure 3D:
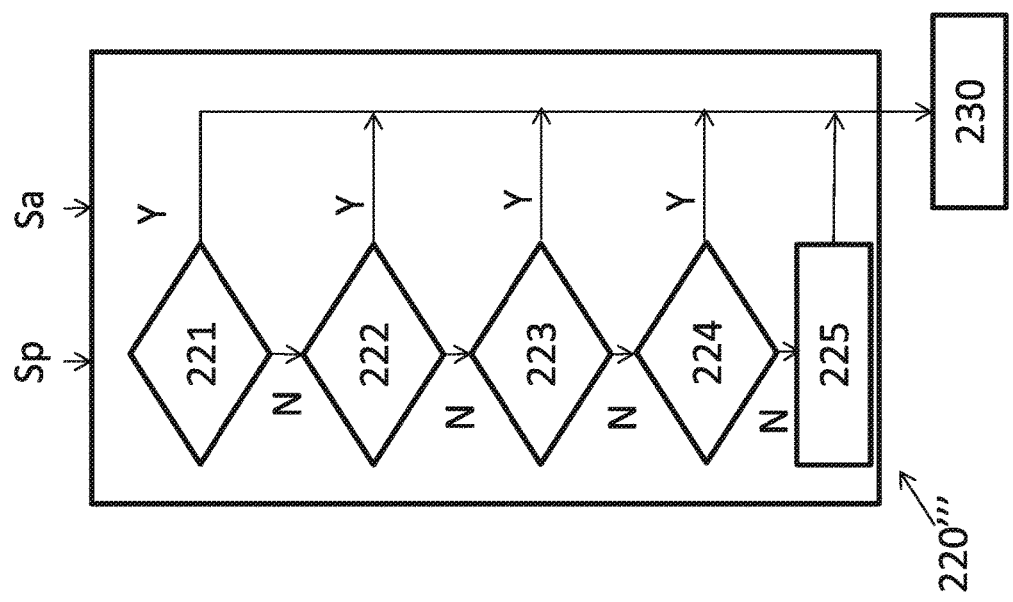

FIGS. 3B, 3C and 3D show respective flowcharts of alternative selection steps 220', 220" and 220"' which may take the place of step 220 in the method of FIG. 2, and in which like reference numerals refer to like method steps.

In selection step 220', shown in FIG. 3B, if step 222 does not result in selection of a single pattern symbol, the method proceeds to step 223 in which it is first checked whether both the primary and alternative symbol would result in a CID count which exceeds a predetermined threshold when appended to the output bit-stream. If this is the case, only that pattern symbol is selected which results in a minimum CID count when appended to a consecutive identical digit tail of the output bit-stream, and the method proceeds with step 230. Otherwise the method proceeds with step 225.

This alternative selection step thus helps to keep the CID count in the output bit-stream low, though it does not guarantee that the CID count is completely minimized, even if neither the primary nor alternative symbol would form a false comma when appended to the output bit-stream. Because the CID count is not completely minimized, further selection criteria can be applied for more pattern symbols than if only those symbols are selected which result in a minimum CID count when appended to the output bit-stream. In either case step 223 helps to keep the CID count in the output bitstream low, thus significantly decreasing the chance of bit-skip occurring during transmission or receipt of the bit-stream.

FIG. 3C shows an alternative selection step 220". Herein, if step 222 does not result in selection of a single pattern symbol, the method proceeds to step 224 in which it is checked whether only one of the primary or alternative pattern symbol would result in a minimum magnitude of direct current balance when appended to the output bit-stream. If this is the case, this symbol is selected and the method proceeds with step 230. Otherwise the method proceeds with step 225. This selection step helps to limit increase of the absolute DC balance of the output bitstream, though this balance is not completely minimized as avoidance of false commas takes precedence.

FIG. 3D shows yet another alternative selection step 220"'. Step 220"' is substantially the same as step 220', except in that if step 223 does not result in selection of a single pattern symbol, the method proceeds to step 224. If step 224 results in selection of a single pattern symbol, then the method proceeds to step 230. Otherwise, if for a pattern word w there exist both a primary and alternative symbol which, when appended to the consecutive identical digit tail of the output bit-stream do not result in a CID count which exceeds the predetermined threshold or which result in equal CID counts, and both symbols have a same absolute DC balance, then one of these is selected in step 225 to be output in step 230. Step 220"' thus allows optimization of the output bitstream such that, in order or priority, first, false commas in the output bitstream are avoided, second, the CID count of the output bitstream is kept low, and third, the absolute value of the DC balance of the output bitstream is kept low.

Figure 4A:
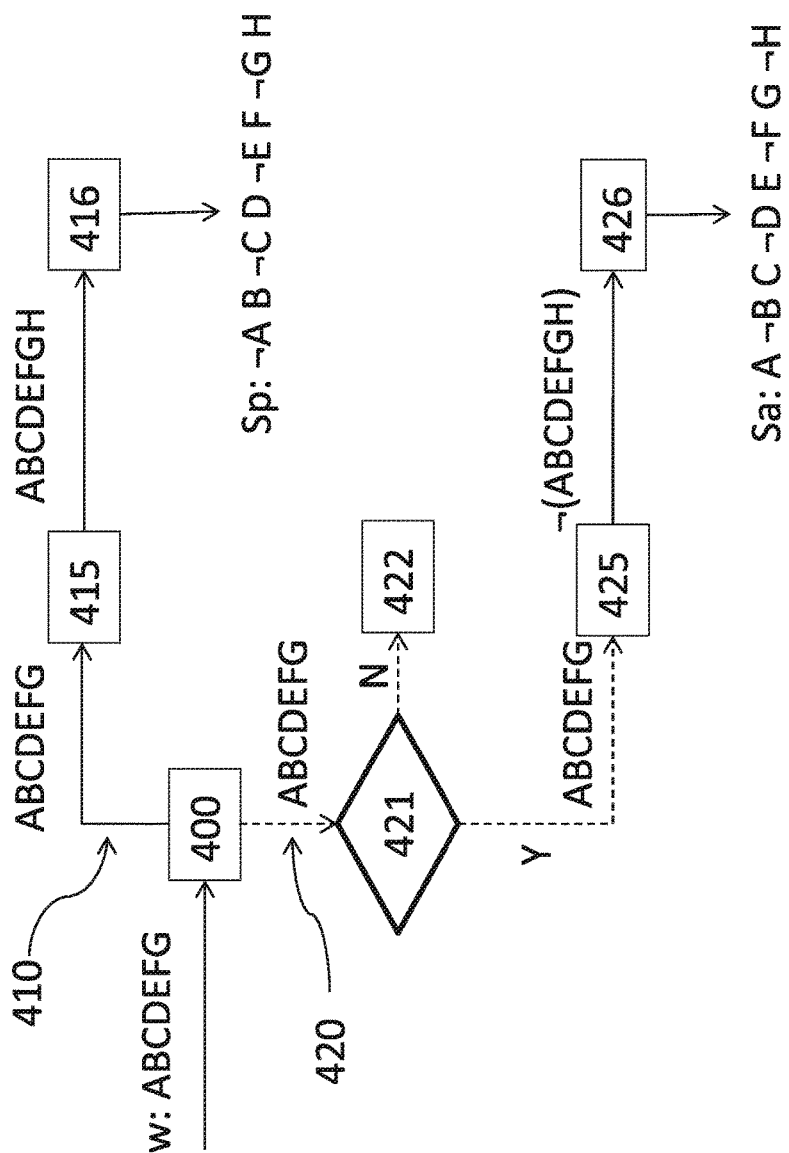
FIG. 4A shows an example of steps for generating, for a pattern word w, a corresponding primary symbol and optionally also a corresponding alternative symbol.

FIG. 4A shows an example of the manner in which, for any 7-bit pattern word w, a corresponding primary symbol Sp and optionally a corresponding alternative symbol Sa is generated, as may for instance be done in step 210 of FIG. 2. Generation of the symbols starts at step 400, in which a pattern word w containing 7 bits with values at bit positions A through G is input. Next to the lines which connect the steps the intermediate values of the pattern symbol under construction are indicated.

In order to generate the corresponding pattern symbol Sp for pattern word w, the upper branch 410 is followed. In the upper branch generating the pattern symbol Sp comprises a step 415 of copying all bit values at positions ABCDEFG of w and appending a bit with value H thereto. The upper branch further comprises a step 416 of inverting the copied bits A, C, E and G. The upper branch thus results in a value for the primary pattern word Sp of $\neg A\ B\ \neg C\ D\ \neg E\ F\ \neg G$ H, with the symbol "¬" representing the inversion function, i.e. if A=1 then ¬A=0 and if A=0 then ¬A=1. The value of H is either 0 or 1, and is typically always the same when the upper branch is followed. For instance, if the value of H is always zero for the upper branch and the pattern word w is equal to "0000 001", then the primary pattern symbol Sp would be equal to "1010 1000", with the rightmost zero thereof corresponding to the value of H.

In the lower branch 420, indicated in FIG. 3A using dotted lines, it is first checked in step 421 whether the pattern word w is an element of a predetermined set of m-bit pattern words. If this is not the case, then the lower branch 420 terminates in step 422 without generating an alternative pattern symbol. Otherwise, branch 420 continues to generate an alternative pattern symbol, said generating comprises a step 425 of copying all bits at positions ABCDEFG and inverting these as well as appending a bit with the inverse value of H, and a subsequent step 426 of inverting the bits at positions A, C, E and G.

For instance, if the value of H is always one for the lower branch and the pattern word w is equal to "0000 001", then the alternative pattern symbol Sa would be equal to "01010111", with the rightmost zero thereof corresponding to the value of H. The same result for any 7-bit pattern word can of course be achieved by making a copy of the bits in the pattern word at positions ABCDEFG, appending a bit with the value 1 at the rightmost end, and inverting bits at positions B, D and F in the copy. If for a pattern word w both a primary symbol and an alternative symbol exist, then the value at position H of the primary symbol Sp is the inverse of the value at position H of the alternative symbol Sa.

Both primary and optionally alternative symbols generated in this manner comprise encoded pattern information at positions ABCDEFG. The symbols further comprise decode information in the form of the value of the bit at position H, so that each pattern symbol allows decoding of the encoded pattern information based only on the pattern symbol itself. E.g., when decoding a pattern symbol "01010111", the last bit being a "1" would indicate that the preceding bits "0101011" should be inverted and that subsequently bits at positions A, C, E and G should be inverted to generate the corresponding pattern word "0000001".

FIG. 4B shows an example input and output when the method according to the invention is carried out with the selection step 220"" shown in FIG. 3D. The in the example the primary and alternative symbols have generated in the manner illustrated in FIG. 4A. It will be appreciated that instead of generating the primary and alternative symbols in this manner, a look-up table may be used having substantially the same contents as table 1 but from which redundant entries of pattern words have been removed.

Table 1 shows in column w a sequence comprising eighteen 7-bit pattern words, wherein the column denoted "#" indicates the order in which the pattern symbols are to be encoded. For each pattern word columns Sp and Sa show the corresponding 8-bit primary and alternative pattern symbols. In the example the primary symbols can easily be distinguished from the alternative symbols by looking at the as the rightmost bit, which is 0 for all primary symbols and which is 1 for all alternative symbols equals 1.

In the present example, all of the pattern words w belong to a predetermined set of pattern words for which both a primary and an alternative pattern symbol have been generated. When n=m+1 and a sequence containing all $2^m$ possible m-bit pattern words is to be encoded then at least some of the pattern words will not be part of this predetermined set as some of the pattern symbol sequences must be avoided, such as pattern symbols which have the same bit sequence as a comma symbol, and preferably also pattern symbols which, when a comma symbol is appended thereto, result in a false comma in the two appended symbols.

Table 2 shows a bit sequence of a comma symbol Sc as may be used in the method according the invention. The comma symbol has a DC balance of zero, and has a CID count of 3. Referring back to table 1, it can be seen that when pattern symbols are generated for pattern words no 5, 15 and 21, the corresponding primary pattern symbol are identical to the comma symbol Sc. These primary symbols, which are indicated in bold in table 1, are thus not suitable to be output in the output bitstream.

Table 3 shows a bitstream as would be output when the sequence of pattern words of Table 1 is encoded according to an embodiment of the present invention, wherein the comma symbol corresponds to the comma symbol Sc of table 2, and wherein every time after having consecutively output 7 pattern symbols the comma symbol is output in order to delimit frames in the output bitstream. The threshold for the tail CID when a pattern symbol is appended to the bit-stream in this example is set to 10.

The columns "," "CID" and "DC", under the heading "Sp" indicate respectively, whether if the primary symbol were appended to the output bit-stream a false comma would be formed in the bitstream, what the tail CID value would be, and what the DC balance of the bitstream would be. A "C" in the column "," indicates that the corresponding pattern symbol would form a false comma when appended to the output bitstream. Columns "," "CID" and "DC under the heading "Sa" respectively indicate the same for the alternative symbol Sa.

When no symbol has been output yet in the bitstream, the output bits stream is understood to be empty and the DC balance of the bitstream equals 0. For pattern word #1, neither Sa nor Sp result in a false comma when appended to the empty bit-stream, and both Sa and Sp, when appended to a CID tail of the bitstream, result in a CID count of 2 and a DC magnitude of 2. In this case, no selection is made based on generation of a false comma, tail CID or absolute DC balance. Instead, simply the primary symbol is selected and is output in the bitstream. Upon output of Sp, the DC balance of the output bitstream becomes −2.

The pattern symbols for pattern words #2 and #3 again do not form a false comma when appended to the output bitstream, and the CID counts for both symbols Sp, Sa for each of the two pattern words do not exceed the threshold of 10. However, both three pattern words the DC magnitude is smaller for Sp than for Sa, Sp is selected and output in the bitstream. For pattern word #4 neither symbols Sp, Sa form a false comma nor does the CID count they exceed the threshold when appended to the output stream, and the DC magnitude for Sa and Sp is the same. Consequently simply the primary symbol is selected and output. For pattern word #5 the primary symbol would form a false comma. Therefore the corresponding alternative symbol is selected and output. For pattern word #6 symbol Sa is selected as it results in the lowest DC magnitude, and for pattern word #7 symbol Sp is selected for the same reason. After seven consecutive pattern words have been output the method outputs a comma symbol in the bitstream to delimit a frame. In the example each frame thus contains 7 8-bit pattern symbols as well as one 8-bit comma symbol Sc having value 01011100 which is shown in bold face.

When pattern word #10 is to be encoded neither of the corresponding pattern symbols Sp or Sa would generate a false comma when appended to the output bitstream. However, as both Sp and Sa when appended to the CID tail of the output bitstream would result in a CID count exceeding the threshold of 10, the symbol which would result in the lowest CID count, i.e. Sa, is selected and output.

After pattern word #14 another comma symbol is output for delimiting the frame. Subsequently outputting the primary symbol Sp for pattern word #15 would result in a false comma. Consequently the alternative symbol Sa is selected and output. It is noted that false commas can occur anywhere in the bitstream and are not confined to boundaries of output pattern symbols. For instance, if after the pattern symbol "10101010" for pattern word #16 the alternative symbol "11100011" for pattern word #17 were output, then the underlined portion in the resulting bit sequence "10101010 11100011" would form a false comma. Consequently, for pattern word #17 the primary symbol Sp is selected and output.

Figure 5:
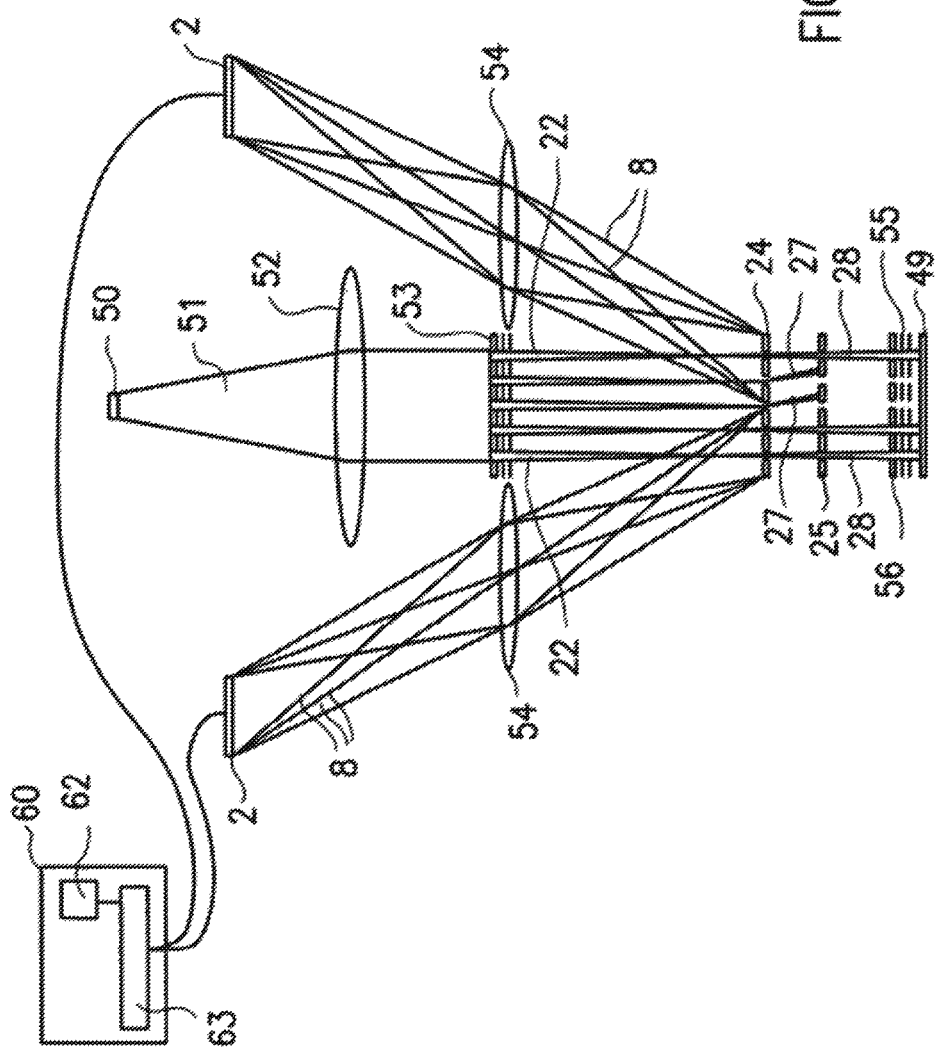
FIG. 5 schematically shows a multi beam lithography system according to the present invention, FIGS. 6A and 6B schematically show an encoding device according to the present invention, and selection circuitry thereof, FIG. 7 schematically shows examples of computer media comprising thereon instructions for causing a computer to perform the method according to the present invention.

FIG. 5 shows a multi-beam lithography system for patterning a target 49 according to the present invention. The system comprises a beam source 50, e.g. a charged particle source or a light source, for generating a diverging beam 51. The system further comprises a collimator 52 for collimating the beam into a substantially parallel beam. The substantially parallel beam impinges on a beam splitter 53, which splits the beam 51 up into a plurality of beamlets 22. Though not shown for reasons of clarity, the plurality of beamlets typically comprises tens of thousands to hundreds of thousands or more beamlets. Downstream of the beam splitter 53 a beam blanker array 24 for individually blanking beamlets of the plurality of beamlets. A beamlet is said to be blanked if it does not reach the target 49, which in this case is a wafer. In the present example, beamlets 27 have been modulated by the blanker array 24 to be deflected from their original path such that beam stop array 25 stops these beams from reaching the target 49, whereas beamlets 28 remain undeflected and proceed to be projected, by means of projection optics 56, onto the target 49. This manner of blanking is particularly advantageous if the multi-beam lithography system is a charged particle multi-beam lithography system. It will be obvious to the skilled person that when the lithography system is a light-based multi-beam lithography system another kind of suitable beam modulator array may be used instead for individually modulating beamlets of light.

Blanking of individual beamlets is performed based on pattern data comprising frames as encoded using an encoding device 63 according to the present invention. The encoding device 63 is part of a pattern streamer 60, which pattern streamer further comprises a memory 62 for storing a sequence of pattern words representative of the pattern that is to be written onto the target 49.

The frames encoded by the encoder 63 are transmitted to two light beam emitters 2 which convert the encoded frames into pattern data carrying light beams 8. The pattern data carrying light beams are projected, via lenses 54, onto the beam blanker array 24. Based on the pattern symbols in the received frames, the beam blanker array 24 individually blanks beamlets of plurality of beamlets 22.

Figure 6:
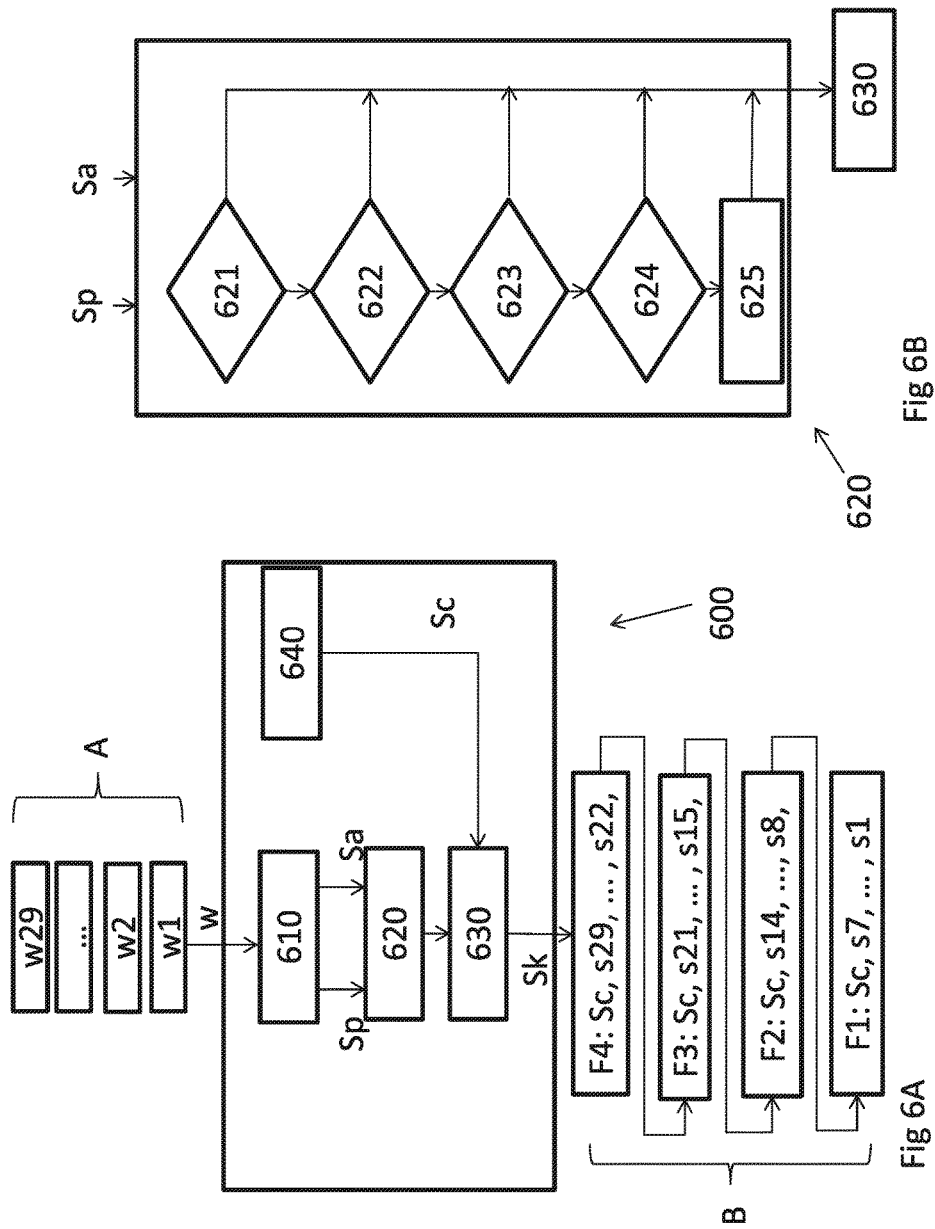

FIG. 6A schematically shows an encoding device 600 according to the present invention, adapted for receiving a sequence of m-bit pattern words w1 . . . w29 and to output as a bit-stream frames F1, F2, F3 and F4. Each of the frames comprises encoded m-bit pattern symbols as well as an n-bit comma symbol Sc.

The encoder 600 comprises symbol generation circuitry 610 which, upon receipt of an m-bit pattern word, generates a corresponding primary n-bit pattern symbol Sp. If the received m-bit pattern word is an element of a predetermined set of pattern words, then the encoder additionally generates a corresponding alternative n-bit pattern symbol Sa. Both the primary and the alternative pattern symbol contain all information necessary in order to derive the m-bit pattern word therefrom.

Typically the symbol generation circuitry 610 generates an alternative pattern symbol for the majority of possible pattern words, such that for the $2^m$ possible pattern words both a primary and an alternative pattern symbol are generated for at least $1+2^{m-1}$ of those pattern words.

The encoding device further comprises symbol selection circuitry 620 adapted for selecting one of the primary and alternative pattern symbols based on a number of conditions or criteria which are described with reference to FIG. 6B.

The selected pattern symbol is subsequently output by output circuitry 630 which is further adapted for outputting a comma symbol Sc in the output bit-stream each time after outputting a fixed number of pattern symbols.

FIG. 6B schematically shows the symbol selection circuitry 620 in more detail. The circuitry 620 receives the primary symbol Sp, and—if available—also the alternative symbol Sa generated by the symbol generation circuitry 610. The symbol selection circuitry comprises a number of circuit sections 621-625.

Circuit section 621 is adapted for receiving a primary symbol Sp and optionally an alternative symbol Sa, and checking whether only a primary symbol has been received. If this is the case, section 621 selects the primary symbol and passes it on to the output circuitry 630.

Otherwise, both the primary and alternative symbols are passed on to section 622 which is adapted for checking whether only one of the primary and alternative symbol does not form a false comma when appended to a directly preceding symbol in the output bit-stream. If this is the case, section 622 selects that symbol and passes it on to the output circuitry.

Otherwise, both the primary and alternative symbol are passed on to section 623 which is adapted for checking whether both symbols would result in a CID count which exceeds a predetermined threshold when appended to the CID tail of the output bitstream. If this is the case, section 623 selects that symbol which results in the lowest CID count when appended to the CID tail of the output bitstream, and passes that symbol on to the output circuitry 630.

Otherwise, both the primary and alternative symbols are passed on to section 624 which is adapted for checking whether only one of the primary and alternative symbol would result in a minimum DC-balance when appended to the output bit-stream. If this is the case, then that symbol is selected and passed on to the output circuitry.

Otherwise, in section 625 one of the primary and alternative symbols is selected. Though this may be achieved by selecting using a comparative condition which only one of the primary and alternative symbol will pass, in the embodiment shown simply the primary symbol is selected and passed on to the output circuitry 630.

FIG. 7 shows examples of computer readable media comprising instructions thereon for causing a computer to perform the method according to the present invention. Optical disc 701 may for instance be a DVD, BluRay disc or any kind of optical or magnetic disc with instructions stored thereon for performing the method according to the invention, and which may be loading into a computer. Chip 702 in the present case is an EPROM chip on which instructions for performing the invention are stored and which for instance may be part of a pattern streamer of FIG.

5. It will be apparent that instructions for performing the method according to the invention may be stored on any kind of computer readable media, such as a volatile or a non-volatile memory, a solid state drive or traditional magnetic disc drives.

In summary the present invention relates to a method and encoding device for encoding a sequence of m-bit pattern words and outputting as a bit-stream a frame comprising corresponding n-bit symbols as well as a predetermined comma symbol, wherein m<n, wherein occurrences of false commas in the output bitstream are avoided. The output bitstream may further be optimized based on CID count and DC balance It is to be understood that the above description is included to illustrate the operation of the preferred embodiments and is not meant to limit the scope of the invention. From the above discussion, many variations will be apparent to one skilled in the art that would yet be encompassed by the scope of the present invention.

The invention claimed is:

1. Method of encoding a sequence of m-bit pattern words and outputting as a bit-stream a frame comprising corresponding n-bit symbols and a predetermined comma symbol, wherein m<n, said method comprising:
   for each of said m-bit pattern words, generating a corresponding primary n-bit symbol, and if said m-bit pattern word is part of a predetermined set of m-bit pattern words, generating a corresponding alternative n-bit symbol;
   selecting the primary n-bit symbol if said generating generates only a primary n-bit symbol, and otherwise:
   i) selecting either said primary n-bit symbol or said alternative n-bit symbol, wherein if only one of said primary n-bit symbols and alternative n-bit symbols, when appended to a directly preceding n-bit symbol in the output bit-stream, does not form a false comma in said two appended symbols, said one n-bit symbol is selected;
   outputting said one selected n-bit symbol as a pattern n-bit symbol in said output bit-stream;
   each time after having consecutively output multiple pattern n-bit symbols in said output bit-stream, outputting said comma symbol in said output bit-stream;
   wherein the multiple pattern n-bit symbols include a number of pattern symbols equal to or less than n, and said primary and said alternative n-bit symbols each comprise encoded pattern information associated with their corresponding m-bit pattern word, said encoded pattern information excluding false commas, and decode information which allows decoding of the encoded pattern information based only upon said n-bit symbol.

2. Method according to claim 1, further comprising, if in step i) neither of the primary and alternative symbols form a false comma in said two appended symbols:
   ii) selecting said primary or alternative symbol which results in a minimum number of consecutive identical digits when appended to a consecutive identical digit tail of the output bit-stream in case both said symbols would result in a number of consecutive identical digits which exceeds a predetermined threshold when appended to the consecutive identical digit tail of the output bit-stream.

3. Method according to claim 2, further comprising, if in step ii) the number of consecutive identical digits would be equal to or below said predetermined threshold for both the primary and alternative symbols when appended to the consecutive identical digit tail of the output bit-stream:
   iii) selecting said primary or alternative symbol which results in a minimum direct current balance magnitude when appended to the output bit-stream.

4. Method according to claim 1, further comprising, if in step 1) neither of the primary and alternative symbols form a false comma in said two appended symbols:
   selecting said primary or alternative symbol which results in a minimum direct current balance magnitude when appended to the output bit-stream.

5. Method according to claim 1, wherein said encoded pattern information of the alternative symbol is generated as the inverse of the encoded pattern information of the primary symbol, preferably wherein the decode information of the alternative symbol is generated as the inverse of the decode information of the primary symbol.

6. Method according to claim 1, wherein said corresponding primary symbol is generated to comprise encoded pattern information as:
   the bits of the m-bit pattern word in which bits at two or more predetermined bit-positions are inverted; or
   the bits of the m-bit pattern word in which all bits other than those at the two or more predetermined bit-positions are inverted;
   wherein said primary pattern symbol further comprises decode information indicative of whether the bits at the two or more predetermined bit positions or all other bits have been inverted, preferably wherein said decode information has the form of a decode information bit.

7. Method according to claim 6, wherein generating said corresponding primary and/or alternative symbol for an m-bit pattern word comprises using a predetermined look-up table.

8. Method according to claim 1, wherein generating said corresponding primary symbol and/or alternative symbol comprises scrambling bits of the corresponding m-bit pattern word, wherein for each m-bit pattern word there is one unique scrambled m-bit pattern word.

9. Method according to claim 1, wherein said predetermined set of m-bit pattern words comprises a majority of possible pattern words.

10. Method according to claim 1, wherein the comma symbol has a direct current balance magnitude of 1 or less and a consecutive identical digit length of 3 or less.

11. Method according to claim 1, wherein each of said primary and alternative symbols is generated such that appending the comma symbol thereto cannot result in a false comma in the two appended symbols.

12. Method according to claim 1, wherein said primary and alternative symbols for each m-bit pattern word are generated such that for said m-bit pattern word a corresponding primary and/or alternative symbol exists having a direct current balance magnitude of 2 or less and a consecutive identical digit length of 3 or less.

13. Computer readable medium, comprising instructions thereon for causing a computer to perform the method according to claim 1.

14. An encoding device configured to receive a sequence of m-bit pattern words and to output as a bit-stream a frame comprising corresponding n-bit symbols and a predetermined comma symbol, wherein m<n,
   said encoding device comprising:
   symbol generation circuitry configured to, upon receipt of each m-bit pattern word, generate a corresponding primary n-bit symbol, and further for generating a corresponding alternative n-bit symbol if said received m-bit pattern word is part of a predetermined set of m-bit pattern words;

symbol selection circuitry adapted for selecting the n-bit primary symbol if said symbol generation circuitry generates only a primary n-bit symbol, and otherwise for performing a step of:
  i) selecting either said primary n-bit symbol or said alternative n-bit symbol, wherein if only one of said primary n-bit symbols and alternative n-bit symbols, when appended to a directly preceding n-bit symbol in the output bit-stream, does not form a false comma in said two appended symbols, said one n-bit symbol is selected;

output circuitry adapted for outputting said one selected n-bit symbol as a pattern symbol in said bit-stream, and adapted for outputting a comma symbol in said bit-stream each time after having consecutively output multiple pattern n-bit symbols in said output bit-stream;

wherein the multiple pattern n-bit symbols include a number of pattern symbols equal to or less than n, and said primary and said alternative n-bit symbols each comprise encoded pattern information associated with their corresponding m-bit pattern word, said encoded pattern information excluding false commas, and decode information which allows decoding of the encoded pattern information based only upon said n-bit symbol.

15. Encoding device according to claim 14, wherein said symbol selection circuitry is further adapted for, if in step i) neither of the primary and alternative symbols form a false comma in said two appended symbols, performing a step of:
  ii) selecting said primary or alternative symbol which results in a minimum number of consecutive identical digits when appended to a consecutive identical digit tail of the output bit-stream in case both said symbols would result in a number of consecutive identical digits which exceeds a predetermined threshold when appended to the consecutive identical digit tail of the output bit-stream.

16. Encoding device according to claim 15, wherein said symbol selection circuitry is further adapted for, if in step ii) the number of consecutive identical digits would be equal to or below said predetermined threshold for both the primary and alternative symbols when appended to the consecutive identical digit tail of the output bit-stream, performing a step of:
  iii) selecting said primary or alternative symbol which results in a minimum direct current balance magnitude when appended to the output bit-stream.

17. Encoding device according to claim 14, wherein the predetermined comma symbol has a DC-balance of 1 or less and a consecutive identical digit length of 3 or less.

18. Encoding device according to claim 14, wherein the symbol generation circuitry is configured for generating said primary and alternative symbols such that at least one of these has a DC-balance of 2 or less and a consecutive identical digit length of 3 or less.

19. Encoding device according to claim 14, wherein the symbol generation circuitry is configured for generating said symbols such that appending the comma symbol to any preceding non-comma symbol cannot result in a false comma in the two appended symbols.

20. Encoding device according to claim 14, wherein each generated symbol comprises encoded pattern information associated with its corresponding m-bit pattern word as well as decode information which allows decoding of the encoded pattern information based only on said n-bit symbol.

21. Encoding device according to claim 20, wherein the symbol generation circuitry is adapted for generating, for each m-bit pattern word, a corresponding primary symbol based on the m-bit pattern word and said decode information, said primary symbol comprising:
  the bits of the m-bit pattern word in which bits of two or more predetermined bit positions are inverted, or
  the bits of the m-bit pattern word in which all other bits than those at two or more predetermined bit positions are inverted;
  wherein said decode information is indicative of whether the bits at the two or more predetermined bit positions or at other bits were inverted.

22. Encoding device according to claim 14, wherein the symbol generation circuitry is adapted for generating a corresponding alternative symbol for an m-bit pattern word as the inverse of the primary symbol.

23. Encoding device according to claim 14, wherein said symbol generation circuitry is adapted for generating said one or more n-bit symbols using a predetermined look-up table.

24. Multi-beam lithography system for patterning a target, said system comprising:
  a memory containing a sequence of m-bit pattern words with pattern data for patterning said target,
  an encoding device according to claim 14, arranged for encoding said m-bit pattern words from said memory and to output as a bit-stream a frame, said frame comprising corresponding n-bit patterns symbols as well as a predetermined n-bit comma symbol which does not occur om any two consecutive n-bit pattern symbols in said output bit-stream,
  a beam source, adapted for providing a plurality of beamlets for patterning the target,
  a beam blanker array, for individually blanking beamlets of said plurality of beamlets based on the pattern symbols in the frames output by the encoding device.

* * * * *